(12) United States Patent
Tonietto et al.

(10) Patent No.: US 7,822,113 B2
(45) Date of Patent: Oct. 26, 2010

(54) INTEGRATED DECISION FEEDBACK EQUALIZER AND CLOCK AND DATA RECOVERY

(75) Inventors: Davide Tonietto, Ottawa (CA); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 1631 days.

(21) Appl. No.: 10/823,252

(22) Filed: Apr. 13, 2004

(65) Prior Publication Data

US 2005/0135471 A1 Jun. 23, 2005

Related U.S. Application Data

(60) Provisional application No. 60/531,094, filed on Dec. 19, 2003.

(51) Int. Cl.
H03H 7/30 (2006.01)
(52) U.S. Cl. .................. 375/233; 375/232; 375/237; 375/376; 327/57; 327/202; 327/166; 327/176
(58) Field of Classification Search .................. 327/57, 327/107, 166, 176, 536, 147, 148, 236, 244, 327/311, 339, 361, 29, 202; 375/232–234, 375/373–376
See application file for complete search history.

(56) References Cited

U.S. PATENT DOCUMENTS

| 4,649,438 | A | * | 3/1987 | Shimizu et al. ............... 386/90 |
| 4,787,097 | A | | 11/1988 | Rizzo |
| 4,862,484 | A | | 8/1989 | Roberts et al. |
| 5,179,302 | A | | 1/1993 | Wagner |
| 5,581,585 | A | | 12/1996 | Takatori et al. |
| 5,671,252 | A | | 9/1997 | Kovacs |
| 5,684,434 | A | * | 11/1997 | Mann et al. ..................... 331/16 |
| 5,774,505 | A | | 6/1998 | Baugh |
| 5,786,951 | A | | 7/1998 | Welland |
| 5,940,441 | A | | 8/1999 | Cranford |
| 6,064,272 | A | | 5/2000 | Rhee |
| 6,069,522 | A | | 5/2000 | Venkatraman |
| 6,144,697 | A | | 11/2000 | Gelfand |

(Continued)

FOREIGN PATENT DOCUMENTS

EP 0808046 A2 11/1997

(Continued)

OTHER PUBLICATIONS

Lee, T. H. et al. "*A 155-MHz Clock Recovery Delay- and Phase-Locked Loop.*" IEEE Journal of Solid-State Circuits, IEEE, Inc., New York, US., vol. 27, No. 12, Dec. 1, 1992, pp. 1736-1746.

(Continued)

*Primary Examiner*—David C Payne
*Assistant Examiner*—Rahel Guarino

(57) ABSTRACT

In an integrated decision feedback equalizer and clock and data recovery circuit one or more flip-flops and/or latches may be shared. One or more flip-flops and/or latches may be used in retiming operations in a decision feedback equalizer and in phase detection operations in a clock recovery circuit. Outputs of the flip-flops and/or latches may be used to generate feedback signals for the decision feedback equalizer. The output of a flip-flop and/or latches may be used to generate signals that drive a charge pump in the clock recovery circuit.

47 Claims, 14 Drawing Sheets

U.S. PATENT DOCUMENTS

| | | | |
|---|---|---|---|
| 6,233,107 | B1 | 5/2001 | Minuhin |
| 6,285,709 | B1 | 9/2001 | Alelyunas |
| 6,340,899 | B1 | 1/2002 | Green |
| 6,366,146 | B2 | 4/2002 | Fredriksson |
| 6,542,038 | B2 | 4/2003 | Nishimura |
| 6,556,637 | B1 * | 4/2003 | Moriuchi ................. 375/350 |
| 6,670,853 | B2 | 12/2003 | Kim |
| 6,807,225 | B1 | 10/2004 | Tonietto |
| 6,873,669 | B2 | 3/2005 | Nakamura |
| 6,919,759 | B2 | 7/2005 | Chuan |
| 6,931,088 | B1 | 8/2005 | Tomita |
| 6,968,167 | B1 | 11/2005 | Wu et al. |
| 6,968,168 | B1 | 11/2005 | Collier |
| 7,016,406 | B1 | 3/2006 | Phanse |
| 7,054,606 | B1 | 5/2006 | Sheng |
| 7,085,328 | B2 | 8/2006 | Lin |
| 7,092,474 | B2 | 8/2006 | Cao |
| 7,272,178 | B2 | 9/2007 | Rahman |
| 7,302,461 | B2 | 11/2007 | Mukherjee |
| 7,321,621 | B2 | 1/2008 | Popescu |
| 7,330,508 | B2 | 2/2008 | Momtaz |
| 7,353,245 | B2 | 4/2008 | Healey |
| 7,436,882 | B2 | 10/2008 | Momtaz |
| 7,471,904 | B2 | 12/2008 | Kaneda |
| 7,522,847 | B2 | 4/2009 | Momtaz |
| 2001/0033407 | A1 * | 10/2001 | Cao ........................ 359/158 |
| 2003/0165208 | A1 | 9/2003 | Carter et al. |
| 2004/0151268 | A1 | 8/2004 | Hidaka |
| 2005/0019042 | A1 | 1/2005 | Kaneda |

FOREIGN PATENT DOCUMENTS

| | | |
|---|---|---|
| EP | 1 331 779 A1 | 7/2003 |
| WO | 0213423 A2 | 4/2002 |
| WO | 2004002023 A2 | 12/2003 |

OTHER PUBLICATIONS

European Search Report for Application No. EP04028869 ; date of completion Nov. 10, 2005, The Hague (2 pages). Annex to the European Search Report on European Patent Application No. EP04028869 (1 page).
Thomas E. Lee, et al., "A 155-MHz Clock Recovery Delay- and Phase-Locked Loop," *IEEE Journal of Solid-State Circuits*, Dec. 1992, pp. 1736-1746, vol. SC-27.
Wikipedia, Latch (electronics), http://en.wikipedia.org/wiki/Gated_D_latch, Feb. 9, 2010.
Wikipedia, Flip-flop (electronics), http://en.wikipedia.org/wiki/Flip-flop_(electronics), Feb. 9, 2010.
Request for Certificate of Correction regarding U.S. Appl. No. 10/774,724 mailed on Apr. 28, 2009.
Notice of Allowance and Fees Due (PTOL-85) regarding U.S. Appl. No. 10/774,724 mailed on Dec. 22, 2008.
Amendment After Final or under 37CFR 1.312 regarding U.S. Appl. No. 10/774,724 mailed on Dec. 22, 2008.
Advisory Action (PTOL-303) regarding U.S. Appl. No. 10/774,724 mailed on Dec. 9, 2008.
Amendment After Final regarding U.S. Appl. No. 10/774,724 mailed on Dec. 8, 2008.
Amendment After Final regarding U.S. Appl. No. 10/774,724 mailed on Oct. 30, 2008.
Final Rejection regarding U.S. Appl. No. 10/774,724 mailed on Jul. 30, 2008.
Amendment/Req. Reconsideration-After Non-Final Reject regarding U.S. Appl. No. 10/774,724 mailed on Jun. 5, 2008.
Non-Final Rejection regarding U.S. Appl. No. 10/774,724 mailed on Feb. 5, 2008.
Amendment Submitted/Entered with Filing of CPA/RCE regarding U.S. Appl. No. 10/774,724 mailed on Jan. 11, 2008.
Pre-Brief Appeal Conference decision regarding U.S. Appl. No. 10/774,724 mailed on Dec. 12, 2007.
Pre-Brief Conference request regarding U.S. Appl. No. 10/774,724 mailed on Oct. 29, 2007.
Advisory Action (PTOL-303) regarding U.S. Appl. No. 10/774,724 mailed on Oct. 5, 2007.
Amendment Submitted/Entered with Filing of CPA/RCE regarding U.S. Appl. No. 10/774,724 mailed on Aug. 29, 2007.
Final Rejection regarding U.S. Appl. No. 10/774,724 mailed on May 29, 2007.
Amendment/Req. Reconsideration-After Non-Final Reject regarding U.S. Appl. No. 10/774,724 mailed on Mar. 2, 2007.
Non-Final Rejection regarding U.S. Appl. No. 10/774,724 mailed on Nov. 2, 2006.
Notice of Allowance and Fees Due (PTOL-85) regarding U.S. Appl. No. 10/774,725 mailed on Sep. 21, 2007.
Amendment/Req. Reconsideration-After Non-Final Reject regarding U.S. Appl. No. 10/774,725 mailed on Jul. 12, 2007.
Non-Final Rejection regarding U.S. Appl. No. 10/774,725 mailed on May 4, 2007.
Notice of Allowance and Fees Due (PTOL-85) regarding U.S. Appl. No. 10/774,965 mailed on Jun. 12, 2008.
Amendment After Final or under 37CFR 1.312 regarding U.S. Appl. No. 10/774,965 mailed on May 21, 2008.
Final Rejection regarding U.S. Appl. No. 10/774,965 mailed on Apr. 4, 2008.
Amendment/Req. Reconsideration-After Non-Final Reject regarding U.S. Appl. No. 10/774,965 mailed on Jan. 16, 2008.
Non-Final Rejection regarding U.S. Appl. No. 10/774,965 mailed on Sep. 20, 2007.
Amendment/Req. Reconsideration-After Non-Final Reject regarding U.S. Appl. No. 10/774,965 mailed on Jul. 27, 2007.
Non-Final Rejection regarding U.S. Appl. No. 10/774,965 mailed on May 9, 2007.
Garrido et ai, "A comparative study of two adaptive continuous-time filters for decision feedback equalization read channels" Jun. 9-12, 1997, Circuits and Systems, 1997. ISCAS '97., Proceedings of 1997 IEEE International Symposium on, pp. 89-92 vol. 1 in "List of references cited by examiner" regarding U.S. Appl. No. 10/774,724 mailed on Jul. 30, 2008.
European Search Report and Annex for Application No. EP04026608; date of completion Dec. 8, 2005, The Hague (2 pages). Cited in Information Disclosure Statement (IDS) Filed (SB/08) regarding U.S. Appl. No. 10/774,725 mailed on Feb. 3, 2006.
European Search Report and Annex for Application No. EP04026612; date of completion Dec. 8, 2005, The Hague (2 pages). Cited in Information Disclosure Statement (IDS) Filed (SB/08) regarding U.S. Appl. No. 10/774,965 mailed on Feb. 3, 2006.
Garrido et al, "A comparative study of two adaptive continuous-time filters for decision feedback equalization read channels" Jun. 9-12, 1997, Circuits and Systems, 1997, ISCAS '97., Proceedings of 1997 IEEE International Symposium on, pp. 89-92 vol. 1.
European Search Report and Annex for Application No. EP04026608; date of completion Dec. 8, 2005, The Hague (2 pages).
European Search Report and Annex for Application No. EP04026612; date of completion Dec. 8, 2005, The Hague (2 pages).

* cited by examiner

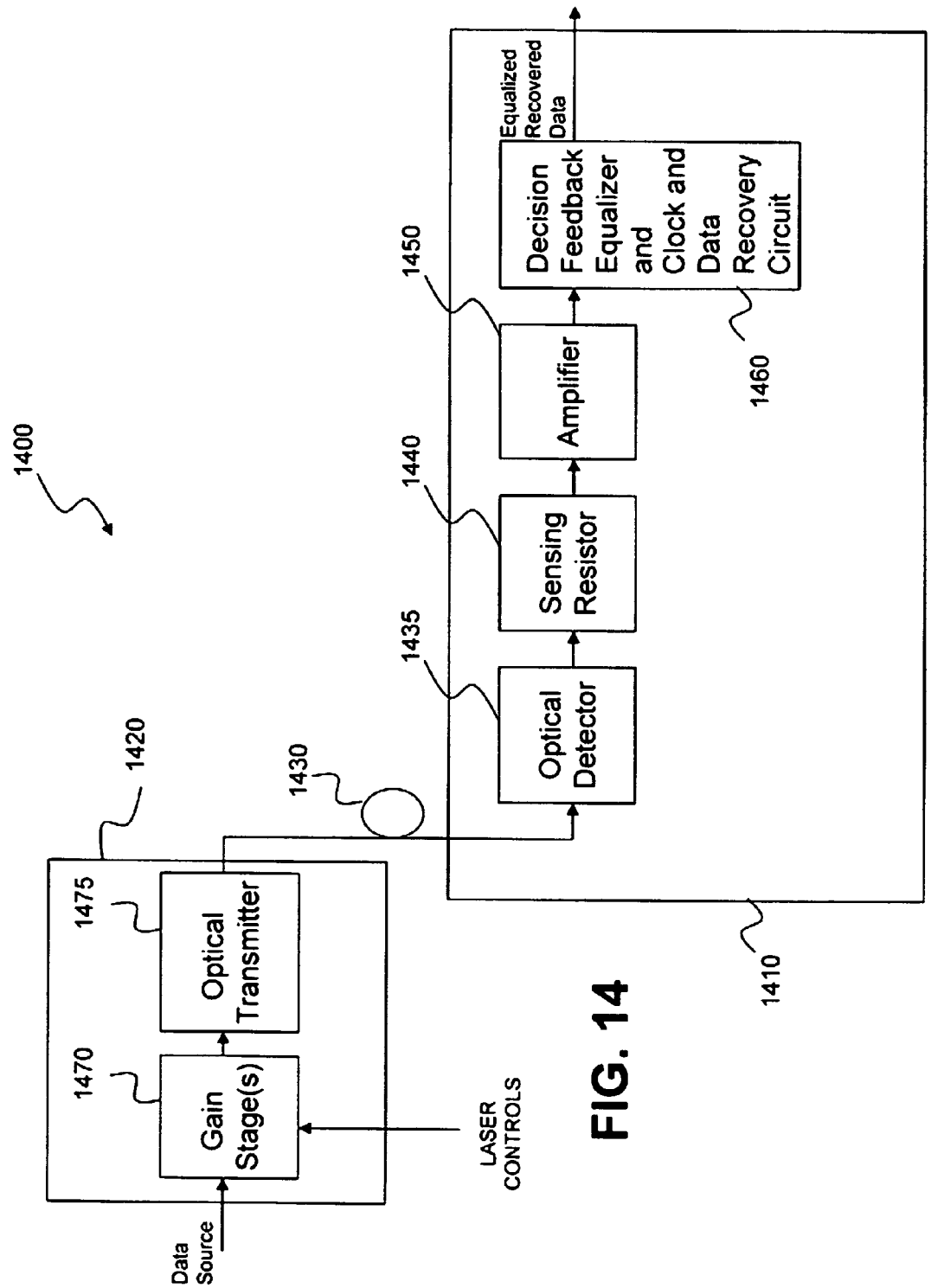

INTEGRATED DECISION FEEDBACK EQUALIZER AND CLOCK AND DATA RECOVERY

CROSS-REFERENCE TO RELATED APPLICATION(S)

This application claims the benefit of U.S. Provisional Patent Application No. 60/531,094, filed Dec. 19, 2003, the disclosure of which is incorporated herein by reference.

This application contains subject matter that is related to the following commonly owned, co-pending patent applications: U.S. patent application Ser. No. 10/774,724, filed Feb. 9, 2004 and issued as U.S. Pat. No. 7,522,847 on Apr. 21, 2009; U.S. patent application Ser. No. 10/774,725, filed Feb. 9, 2004 and issued as U.S. Pat. No. 7,330,508 on Feb. 12, 2008; and U.S. patent application Ser. No. 10/774,965, filed Feb. 9, 2004 and issued as U.S. Pat. No. 7,436,882 on Oct. 14, 2008, the disclosure of each of which is incorporated herein by reference.

BACKGROUND

Many high speed serial communication systems only transmit data over the communication media. That is, the transmitters in communications systems may not transmit a separate clock signal with the data. Such clock signals could be used by a receiver to efficiently recover data from the data stream in the signal received via the communication media.

Consequently, a receiver for a high speed serial communication system may include a clock and data recovery circuit that produces a clock signal synchronized with the incoming data stream. For example, the clock and data recovery circuit may process the incoming data stream to generate a clock signal at a frequency that matches the frequency of the data stream. The clock is then used to sample or recover the individual data bits from the incoming data stream.

FIG. 1 illustrates a portion of a typical receiver that includes a clock and data recovery circuit ("CDR") 100. The clock and data recovery circuit 100 utilizes a clock recovery circuit 10 and a retimer 20 to generate recovered data 30. Typically, incoming data 40 is amplified by one or more buffer stages 50 and the clock recovery circuit 10 generates an extracted clock signal 70 that has a phase and/or frequency that is fixed relative to the phase and/or frequency of the incoming amplified data 80.

The clock recovery circuit 10 may comprise a phase lock loop or delay lock loop that aligns the edges of the extracted clock, for example the rising edge, with the transition edges of the incoming data. In this instance the falling edge of the clock is approximately in the middle of the incoming data symbol. In this instance the retimer 20 may comprise, by way of example, a falling edge flip-flop that is triggered to recover the transmitted data on the falling edge of the clock.

In operation, however, bandwidth limitations inherent in many communication media tend to create increasing levels of data distortion in the received signal. For example, band-limited channels tend to spread transmitted pulses. If the width of the spread pulse exceeds a symbol duration, overlap with neighboring pulses may occur, degrading the performance of the receiver. This phenomena is called inter-symbol interference ("ISI") . In general, as the data rate or the distance between the transmitter and receiver increases, the bandwidth limitations of the media tend to cause more inter-symbol interference. Therefore, typical high speed receivers may include an adaptive equalizer, such as, for example, a decision feedback equalizer ("DFE") that may cancel inter-symbol interference.

FIG. 2 is a simplified block diagram of a conventional one tap decision feedback equalizer 200 where a summer 210 combines incoming data 220 with a feedback signal 230. A slicer 240 converts the output of the summer (soft decision) to a binary signal. A flip-flop 250 recovers the data from the binary signal in response to a clock 260. A multiplier 270 multiples the recovered data by an equalization coefficient (typically a negative number) to generate a scaled feedback signal 230 (typically a negative number) that is then combined with incoming data. The equalizer therefore serves to subtract a previous symbol from a current symbol to reduce or eliminate channel induced distortion such as inter-symbol interference.

In conventional receivers the extracted clock from the clock and data recovery circuit drives the flip-flop to recover equalized data. For example, FIG. 3 is a simplified block diagram of a decision feedback equalizer and clock and data recovery circuit based receiver 300. In this receiver incoming data is again amplified by one or more buffer stages 310. A clock recovery circuit 320 generates an extracted clock 330 from the amplified data (D1) and drives the decision feedback equalizer flip-flop 340 that recovers the equalized (D2) data provided by slicer 350.

In the illustrated receiver the clock recovery circuit 320 may align the rising edge of the extracted clock 330 with the transition edge of the amplified data D1. In practice, however, the rising edge of the extracted clock 330 should be aligned with the equalized data (D2) output by the slicer 350 for effective data recovery by flip-flop 340. Therefore, the time delay through summer 360 and slicer 350 should be equal to the time delay through buffer stage(s) 310 to ensure that the input data (D2) and clock signal 330 of flip-flop 340 are aligned to properly recover the equalizer data. Accordingly, conventional receivers typically include delay matching stages (not shown) to adjust the delay through the buffer stage(s) 310 to match the delay through summer 360 and slicer 350 to align the binary signal (D2) and extracted clock signal 330.

In high speed applications, the high speed receiver components may require relatively large amounts of current and dissipate relatively large amounts of heat. Moreover, in very high speed CMOS applications (10 Gbps, for example), the high speed components may be implemented using shunt peaking techniques and on-chip spiral inductors. As a result, these components may occupy a relatively large area on the silicon chip. In addition, the use of these components may result in a design with longer interconnect lines and corresponding larger parasitic capacitance. These characteristics may have a negative impact on the performance of the system.

SUMMARY

The invention relates to integrated receiver components such as an integrated decision feedback equalizer and clock and data recovery circuit or components thereof.

In one aspect of the invention, one or more flip-flops and/or latches are shared by a decision feedback equalizer and a clock recovery circuit to provide an integrated decision feedback equalizer and clock and data recovery circuit.

In one aspect of the invention, one or more flip-flops and/or latches are used in retiming operations in a decision feedback equalizer and in phase detection operations in a clock recovery circuit. For example, in one embodiment, the output of a slicer in a decision feedback equalizer drives a pair of flip-flops connected in series. The flip-flops comprise a pair of latches. The outputs of the two flip-flops are used to generate feedback signals for the decision feedback equalizer. In addition, the output of the first flip-flop and the output of each of the latches in the second flip-flop are used to generate signals that drive a charge pump in the clock recovery circuit. In this circuit, the output of the second flip-flop provides the recovered data.

The above embodiment may provide a circuit with fewer high-speed flip-flops as compared to some conventional receivers. As a result, the resulting circuit may advantageously be made smaller and may dissipate less power.

In one aspect of the invention, one or more flip-flops are used in retiming operations in a decision feedback equalizer and in triwave phase detection operations in a clock recovery circuit. For example, in one embodiment, the output of a slicer in a decision feedback equalizer drives three flip-flops connected in series. The flip-flops comprise a pair of latches. The outputs of the flip-flops are used to generate feedback signals for the decision feedback equalizer. In addition, the output of the first flip-flop, the output of each of the latches in the second flip-flop and the output of the first latch in the third flip-flop are used to generate signals that drive a charge pump in the clock recovery circuit. In this circuit, the output of the third flip-flop provides the recovered data.

In some aspects of the invention, integration techniques as taught herein may be applied to decision feedback equalizers with different numbers of feedback paths. For example, integrated latches may be employed in decision feedback equalizers with one, two or more feedback paths.

BRIEF DESCRIPTION OF THE DRAWINGS

These and other features, aspects and advantages of the present invention will be more fully understood when considered with respect to the following detailed description, appended claims and accompanying drawings, wherein:

FIG. 14 is a simplified block diagram of one embodiment of an optical communication system.

Figure 1:
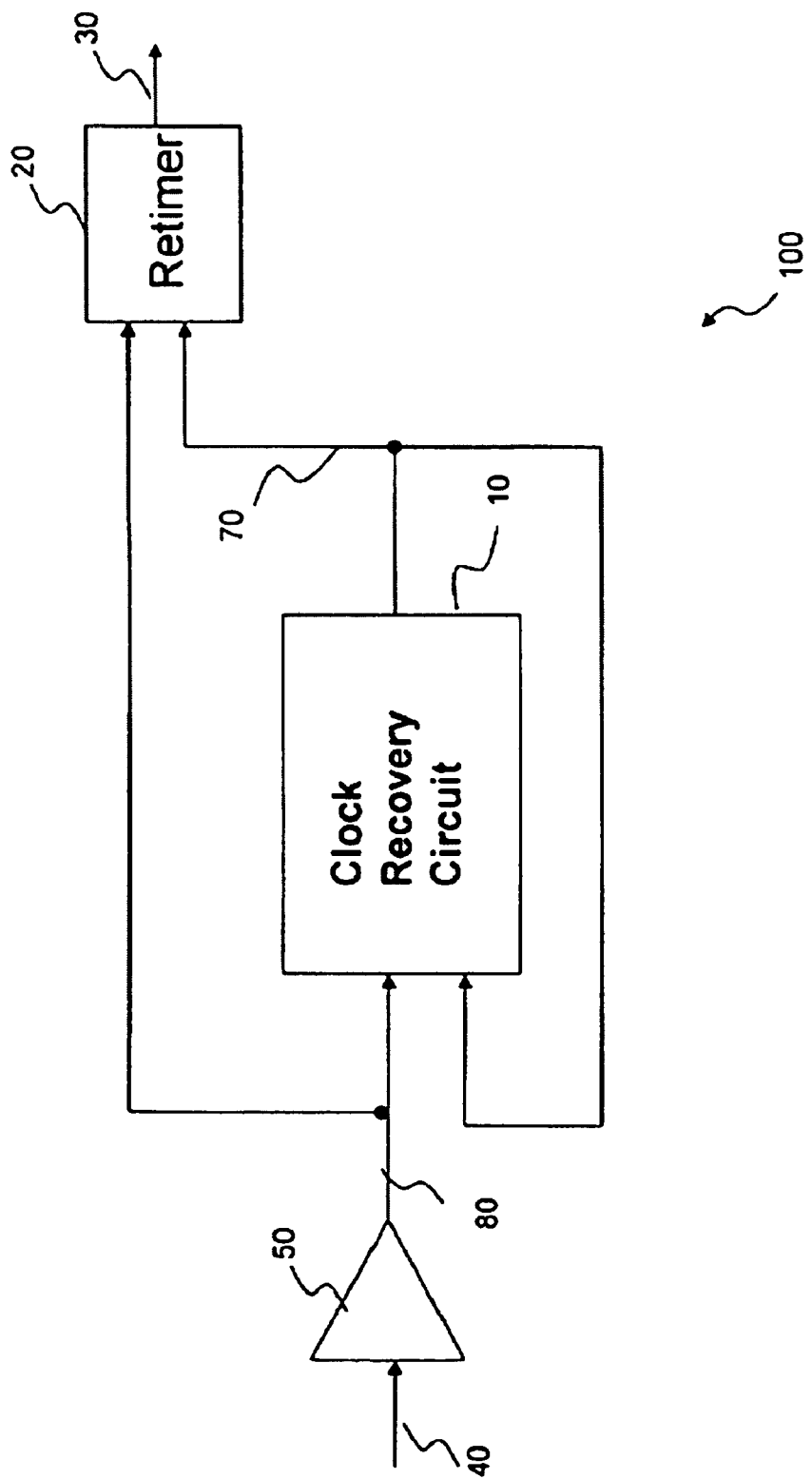
FIG. 1 is a simplified block diagram of a clock and data recovery circuit.
Figure 2:
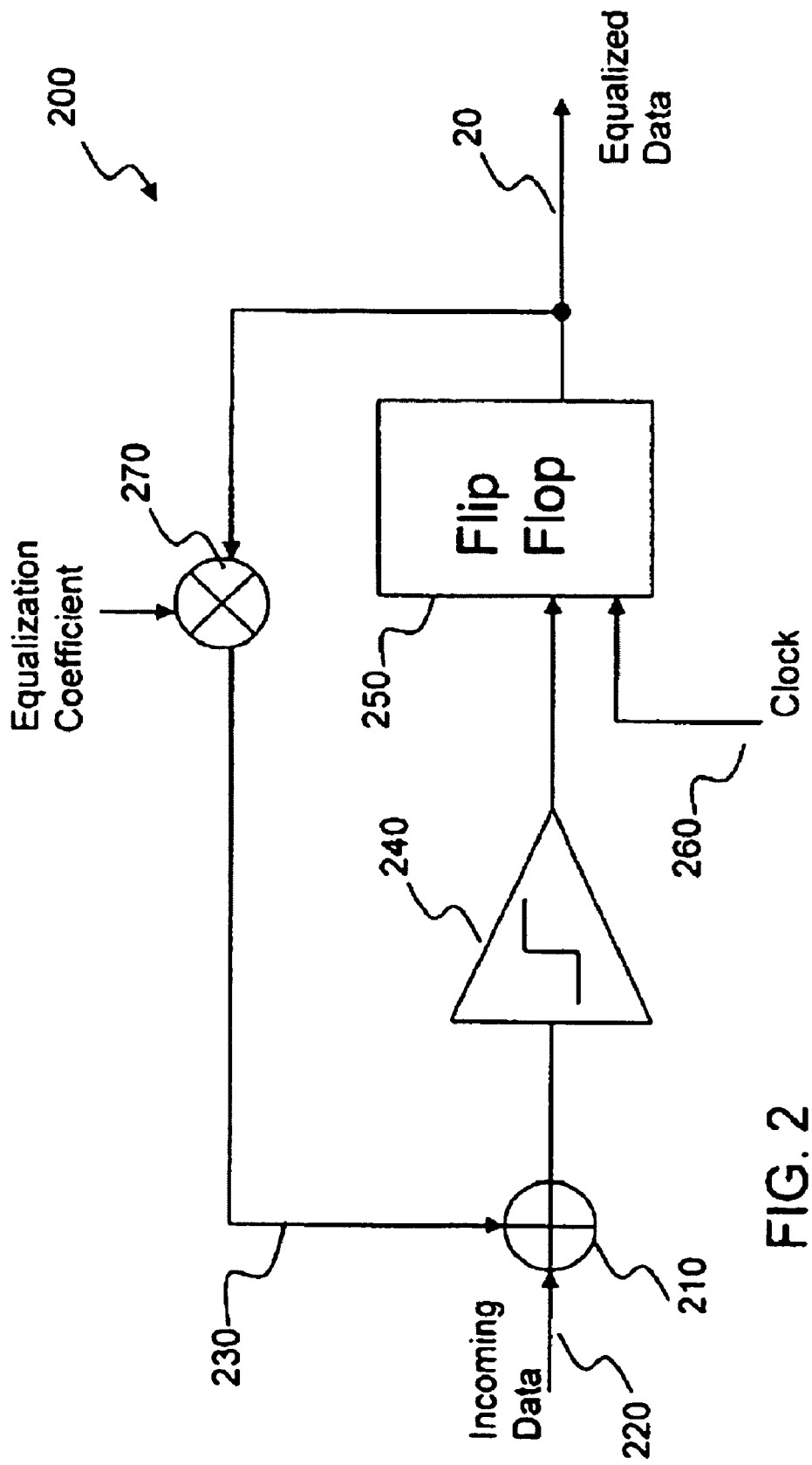
FIG. 2 is a simplified block diagram of a decision feedback equalizer.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals denote like features throughout the specification and figures.

DETAILED DESCRIPTION

The invention is described below, with reference to detailed illustrative embodiments. It will be apparent that the invention may be embodied in a wide variety of forms, some of which may be quite different from those of the disclosed embodiments. Consequently, the specific structural and functional details disclosed herein are merely representative and do not limit the scope of the invention.

Figure 4:
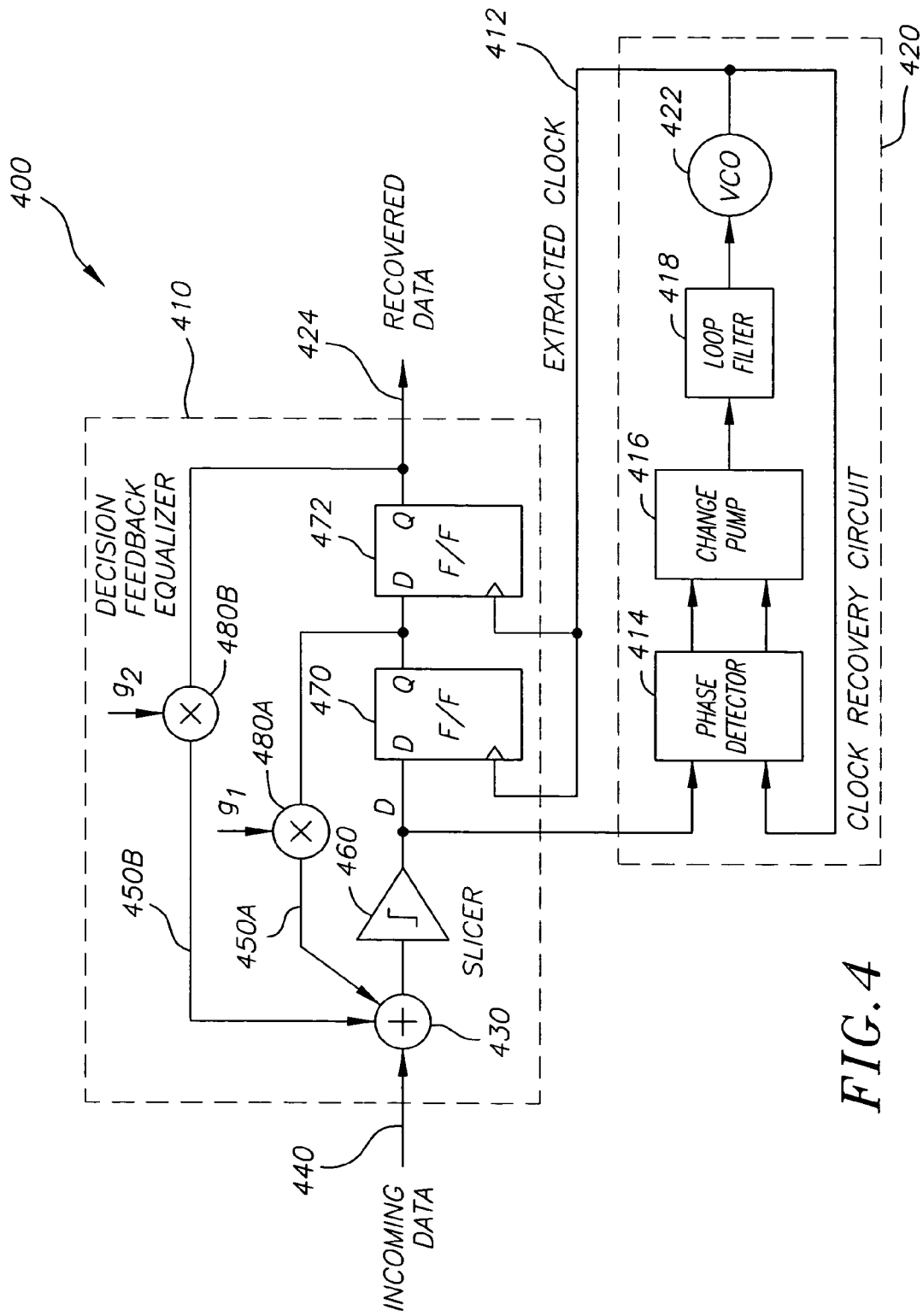
FIG. 4 is a simplified block diagram of one embodiment of a decision feedback equalizer and a clock recovery circuit constructed in accordance with the invention.

FIG. 4 illustrates one embodiment of a two tap decision feedback equalizer 410 combined with a clock recovery circuit 420 for a high performance receiver 400. In this embodiment summer 430 combines an incoming data signal 440 with two equalized feedback signals 450A and 450B. A slicer 460 converts the output of the summer (a soft decision data signal) to a binary data signal (D).

Figure 3:
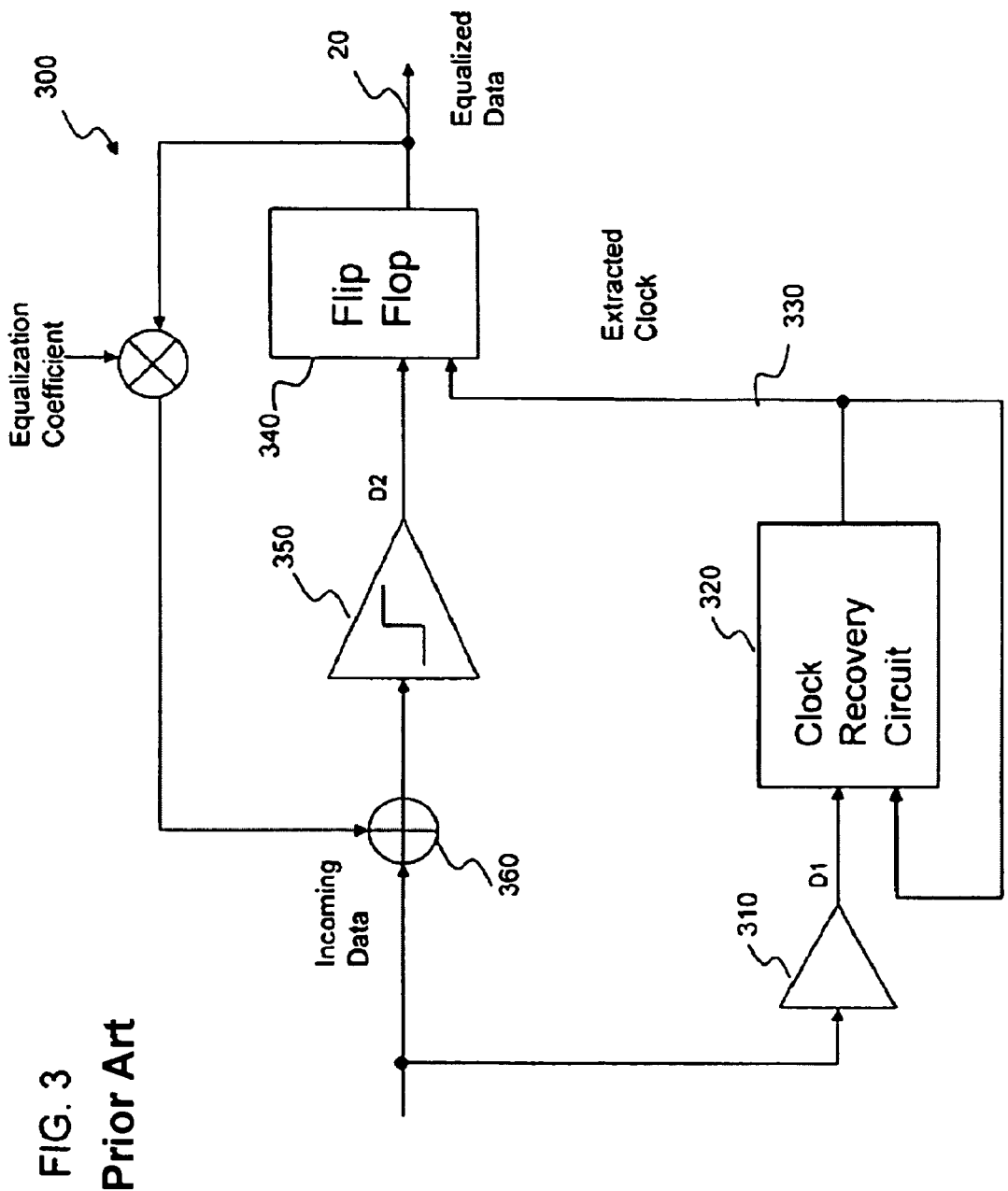
FIG. 3 is a simplified block diagram of a decision feedback equalizer and a clock recovery circuit.

In this embodiment, a binary data signal (D) output by the slicer 460 directly drives the data input of flip-flop 470 as well as the clock recovery circuit 420. The clock recovery circuit 420 therefore generates an extracted clock signal 412 from the binary signal (D) output by the slicer rather than from the incoming data 440 as may be done in conventional receivers (see FIG. 3).

The clock recovery circuit 420 may align the rising edge of the extracted clock, for example, with transitions in the binary signal (D) output by the slicer 460. Therefore, the illustrated embodiment may maintain the proper timing relationship between the drive data (D) and the clock (e.g., the extracted clock signal 412) for the flip-flop 470 to ensure effective data recovery.

In the embodiment of FIG. 4, the clock recovery circuit 420 includes a phase detector 414, a charge pump 416, a loop filter 418 and a voltage controlled oscillator ("VCO") 422. The extracted clock 412 generated by the VCO is fed back to the phase detector 414. The phase detector 414 compares the transition edge of the data signal (D) with an edge of the extracted clock and generates a corresponding phase error signal that is sent to the charge pump 416. The charge pump 416 produces a current that corresponds to the phase error signal and provides this current to the loop filter 418. The loop filter 418 removes selected undesirable frequency components from the current signal and sends a corresponding voltage signal to the VCO 422. The VCO 422 then adjusts the extracted clock phase according to this voltage signal.

The extracted clock signal 412 output by the clock recovery circuit 420 also is used to clock the decision feedback equalizer flip-flops 470 and 472 that recover the data from the binary signal (D). Specifically, the extracted clock signal 412 is used to clock the binary signal (D) into flip-flop 470. In addition, the extracted clock signal 412 clocks the output of flip-flop 470 into flip-flop 472. In this two tap decision feedback equalizer implementation, the output of the second flip-flop 472 generates a recovered data signal 424 that provides equalized data that has been recovered from the incoming data signal 440.

In the illustrated embodiment, a multiplier 480A scales the recovered equalized data output by flip-flop 470 by an equalization coefficient (g1) to generate a scaled equalized feedback signal 450A.

Similarly, a multiplier 480B scales the recovered equalized data output from the flip-flop 472 by an equalization coefficient (g2) to generate another scaled equalized feedback signal 450B.

The value of the equalization coefficients depends on the level of inter-symbol interference that is present in the incoming data. Typically the absolute value of an equalization coefficient (usually a negative number) increases with increasing inter-symbol interference. In one embodiment a real time optimization loop (not shown), such as a least mean square optimization loop, monitors the bit error rate of the equalized signal and adjusts the value of the equalization coefficient in response to changes in the bit error rate.

Summer 430 combines the equalized feedback signals 450A and B (typically negative numbers) with the incoming data 440. The summer therefore subtracts a scaled version of the previous symbols from a current (that is, current, in time) symbol to reduce or eliminate channel induced distortion such as inter-symbol interference. Therefore, in this embodiment, equalized data (i.e. data that has been processed to remove inter-symbol interference) drives the clock recovery circuit 420. As a result, the clock recovery circuit 420 may more readily lock onto the binary signal (D) as compared to circuits that lock onto the incoming data 440.

Figure 5:
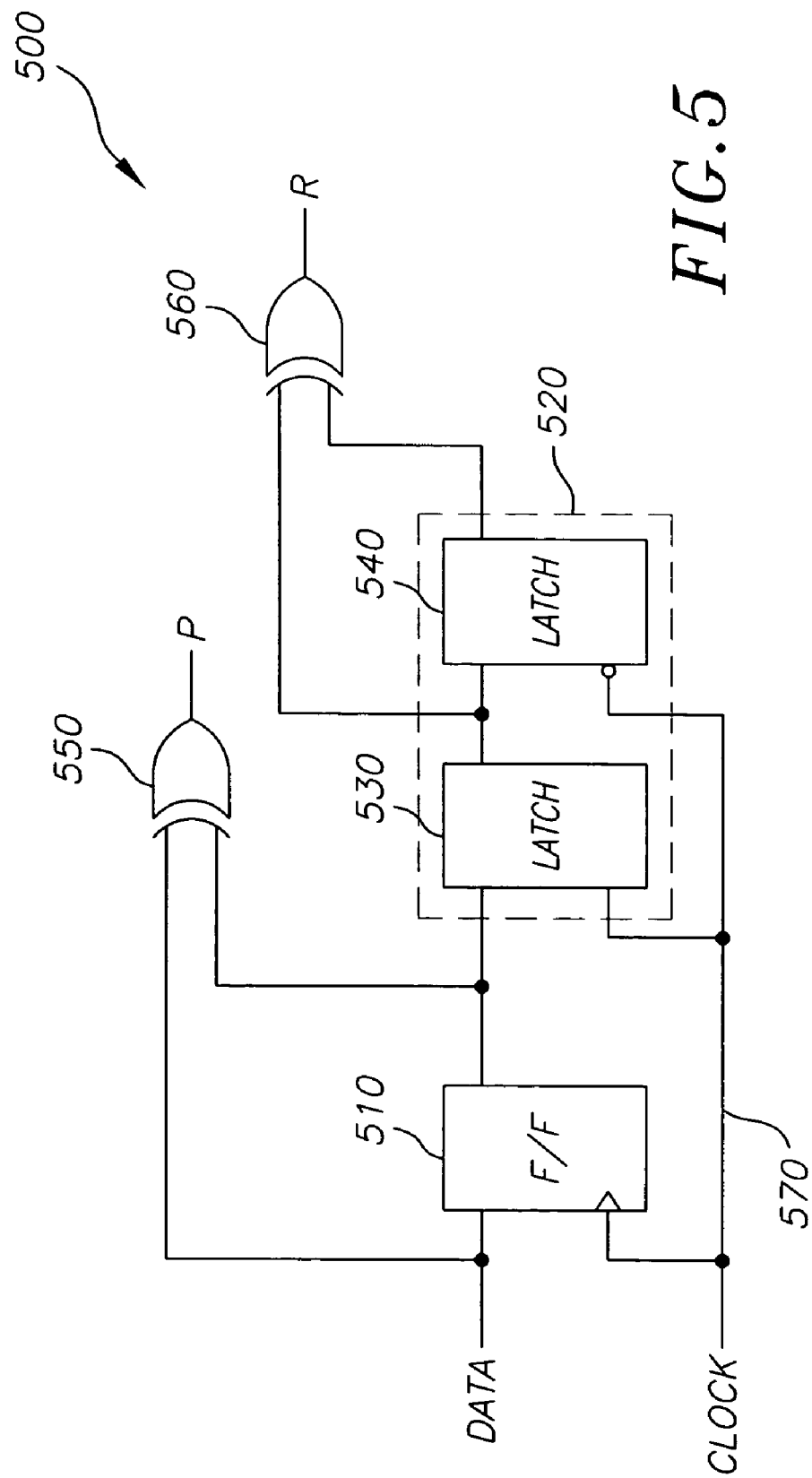
FIG. 5 is a simplified block diagram of one embodiment of a phase detector constructed in accordance with the invention.

The phase detector may be implemented in various ways. Typically, a phase detector consist of one or more flip-flop(s) and logic gate(s). FIG. 5 illustrates one embodiment of an extended linear phase detector 500 that includes two flip-flops 510 and 520 and an XOR circuit that includes two XOR gates 550 and 560. Since a flip-flop may consist of two latches, the second flip-flop 520 is depicted as two latches 530 and 540.

In the embodiment of FIG. 5, the two flip-flops 510 and 520 clock data on the falling edge of the clock 570. The two latches 530 and 540 are clocked by different polarities of the clock signal 570. For example, in the embodiment of FIG. 5, latch 530 samples (i.e., passes) its input signal when the clock signal 570 is high and holds its output signal when the clock signal 570 is low. In contrast, the latch 540 samples when the clock signal 570 is low and holds when the clock signal 570 is high.

The XOR circuit generates a pair of phase detector output signals. The data input and data output signals for the first flip-flop 510 provide internal phase detector signals for the first XOR 550. The XOR 550 generates a phase detector output signal P that has a pulse width proportional to data/clock phase error. The data output signal of the first latch 530 and the data output signal of the second latch 540 provide internal phase detector signals for the second XOR 560. The XOR 560 generates a phase detector output signal R that is used as a reference for phase error evaluation.

In high-speed applications, the design of phase detector flip-flops (and latches) may be relatively challenging because they operate at a high rate of speed. For example, data delays between and within the flip-flops and latches must be accounted for to ensure that the correct data is being latched. The flip-flop and latch implementation in FIG. 5 may advantageously be used to provide a CMOS phase detector that operates properly at frequencies on the order of 10 GHz.

A phase detector similar to the one depicted in FIG. 5 is described in U.S. patent application Ser. No. 10/293,163 filed Nov. 12, 2002, the disclosure of which is incorporated herein by reference. See, for example, FIG. 4 and the accompanying disclosure.

Figure 6:
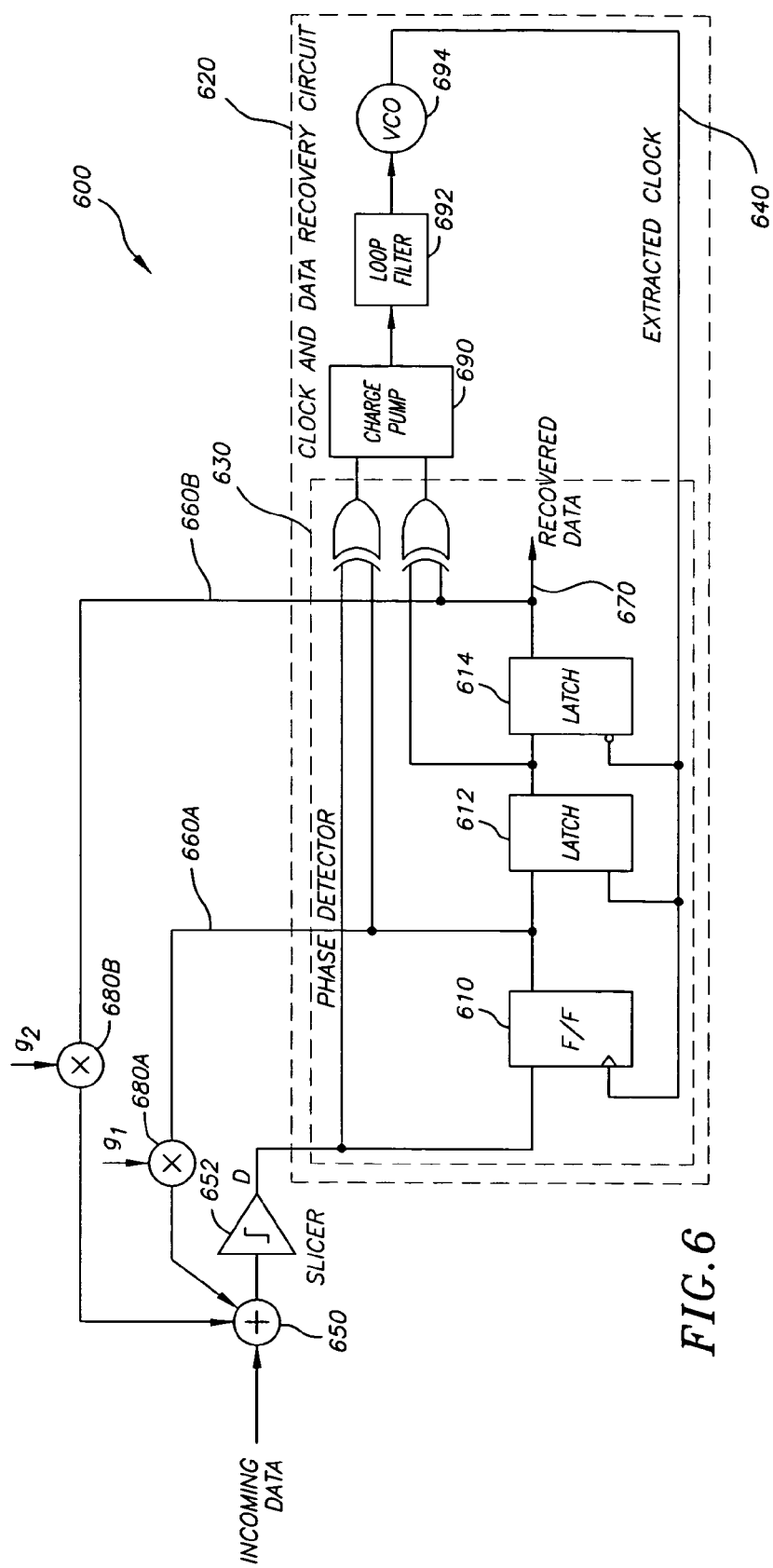
FIG. 6 is a simplified block diagram of one embodiment of an integrated decision feedback equalizer and clock and data recovery circuit constructed in accordance with the invention.

FIG. 6 illustrates one embodiment of an integrated two tap decision feedback equalizer and clock and data recovery circuit 600. A phase detector 630 in a clock and data recovery circuit 620 incorporates the design of the phase detector 500 of FIG. 5.

In the embodiment of FIG. 6, the architecture of the receiver includes an integrated phase detector and retimer to reduce the number of high-speed components in the receiver. That is, the CDR phase detector flip-flops (flip-flop 610 and latch pair 612 and 614) also function as DFE retimers. These flip-flops may be shared because in the architecture of FIG. 6 the flip-flops for a CDR phase detector may operate from the same signals (e.g., binary data signal (D) and an extracted clock signal 640) as the flip-flops for a DFE retimer.

The data outputs signals from the two flip-flops also provide the DFE tap signals for the DFE feedback loop. Specifically, the output signals 660A and 660B are multiplied by equalization coefficients g1 and g2 at multipliers 680A and 680B, respectively, then provided to a summer 650.

As discussed above a slicer 652 digitizes the output of the summer 650 to generate the binary data signal (D) that is provided to the first flip-flop 610. In this embodiment, the output of the second flip-flop provides the recovered data signal 670.

The P and R outputs of the phase detector 630 are fed to a charge pump 690. The charge pump 690 provides a current to a loop filter 692 which provides a voltage signal to VCO 694. The VCO 694 generates the extracted clock signal 640 that clocks the two flip-flops.

Reducing the number of flip-flops in the receiver provides significant advantages, particularly when the flip-flops are high speed flip-flops. In the embodiment of FIG. 6, the DFE high-speed blocks are the summer, limiter and the flip-flops. In the CDR, the high-speed blocks are mainly the VCO and the phase detector flip-flops. The extracted clock signal typically is the fastest signal on the chip (e.g., 10 GHz, whereas the fastest data signal may be 10 Gbps), and its relatively high load effect may limit the maximum operational speed of the chip. Hence, the elimination of DFE flip-flops may be significant for enabling DFE based receiver functionality at 10 Gbps in CMOS technology. Moreover, since each flip-flop consists of two latches, a flip-flop is almost twice as large as a buffer (e.g., a summer, limiter, etc) and may consume twice as much power.

In addition, reducing the number of flip-flops may advantageously impact the implementation of other components in the receiver. For example, since the VCO drives only 2 flip-flops in the embodiment of FIG. 6, instead of 4 flip-flops as in FIG. 4, the capacitive loading on the VCO is reduced significantly. Furthermore, since the slicer drives only the phase detector, the slicer sees a smaller capacitive load (as compared to circuits where the slicer drives DFE flip-flop(s) as well) and hence requires less current. As a result, these components may be made smaller and other design problems associated with a high speed, high current implementation of such components (e.g., noise and shielding) may be reduced or avoided.

In summary, the elimination of two high speed flip-flops as provided by the embodiment of FIG. 6 may provide a circuit with smaller silicon die area, shorter interconnect lines (with a corresponding reduction in parasitic components), significantly lower power consumption and other advantages.

Figure 7:
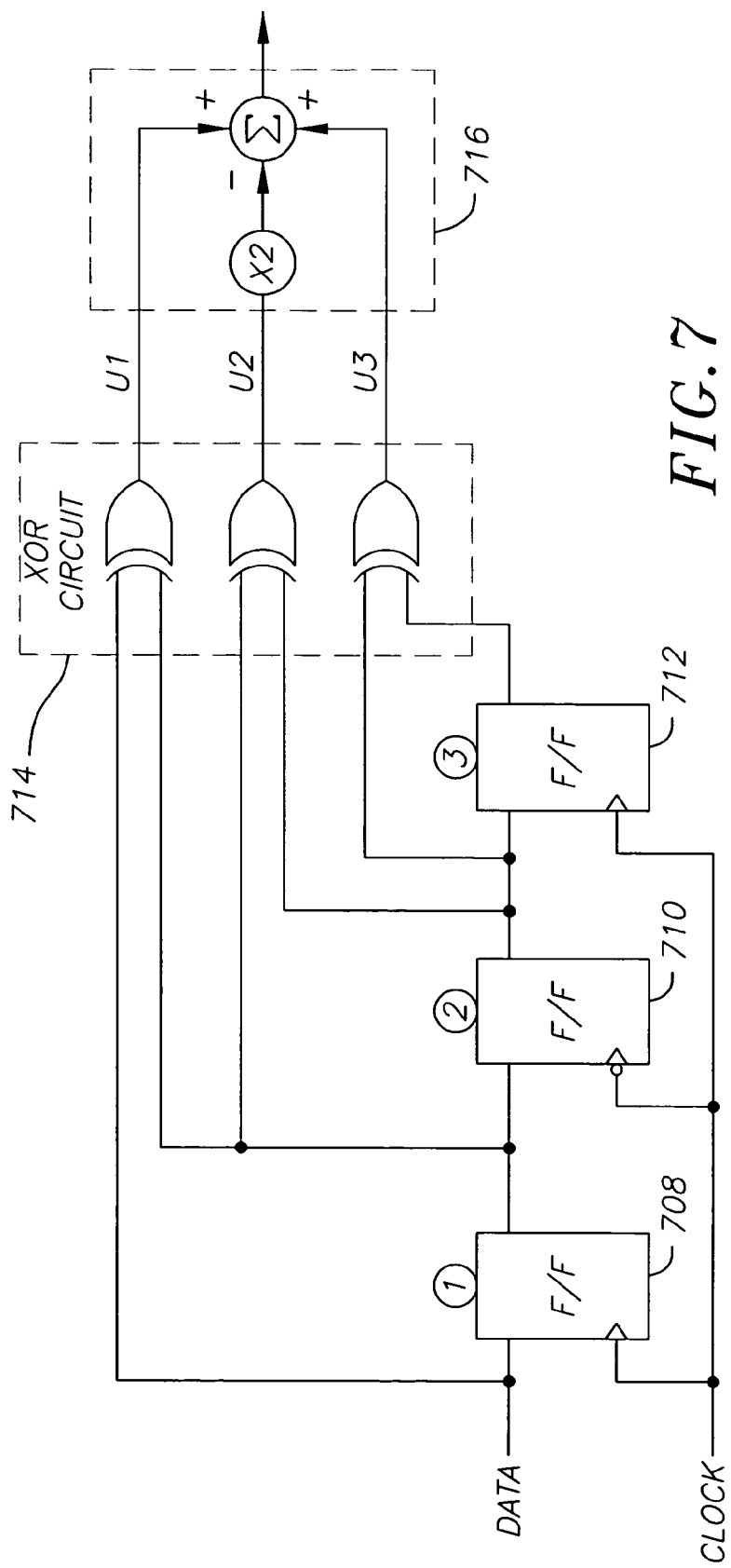
FIG. 7 is a simplified block diagram of one embodiment of a triwave phase detector.

The above techniques may be applied to other types of phase detectors. FIG. 7 depicts a simplified block diagram of one embodiment of a triwave phase detector. The triwave phase detector includes flip-flops 708, 710 and 712, an XOR circuit 714 and an optional summer circuit 716. In a triwave phase detector, data jitter dependence of the CDR is reduced in comparison to a traditional Hogge detector.

A description of example operations and implementations of a triwave phase detector is described in the paper: "A 155 MHz Clock Recovery Delay- and Phase-Locked Loop," T. Lee and J. Bulzacchelli, IEEE Journal of Solid-State Circuits, vol. SC-27, pp. 1736-46, December 1992, the content of which is incorporated herein by reference.

As described in the Lee paper, the triwave phase detector generates three outputs U1, U2 and U3 that may be sent to a charge pump. In addition, as shown in FIG. 15 of the Lee paper and in FIG. 7, the output stage of the triwave phase detector may include a circuit (e.g., circuit 716) that provides the summation of U1 and U3 minus 2U2.

Figure 8:
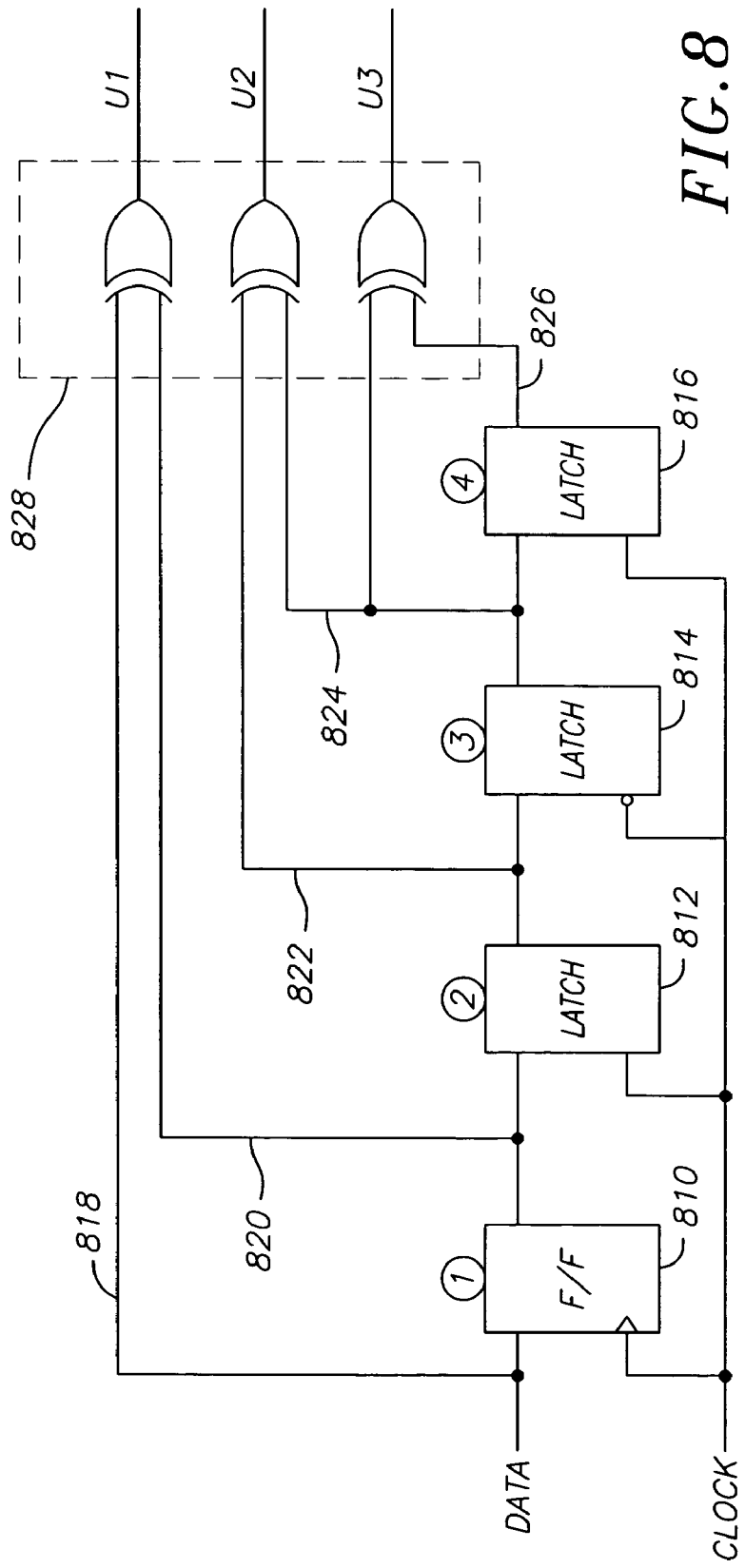
FIG. 8 is a simplified block diagram of one embodiment of a triwave phase detector constructed in accordance with the invention.

FIG. 8 depicts one embodiment of a modified triwave phase detector that accommodates the sharing of flip-flops with the DFE in accordance with the invention. The second flip-flop (falling edge triggered flip-flop 710) in FIG. 7 is replaced in FIG. 8 with a rising edge triggered flip-flop (represented by latches 812 and 816). This transformation of falling edge to rising edge flip-flop enables sharing of DFE flip-flops. The third flip-flop 712 in FIG. 7 is replaced in FIG. 8 with a single latch 816 (the second latch for this flip-flop may be eliminated for the phase detector).

The flip-flop and the latches provide phase detector input signals for an XOR circuit 828 that generates phase detector output signals U1, U2 and U3. The U1 phase detector signal is generated from signals 818 and 820 in a manner similar to that depicted in FIG. 7. However, in contrast with FIG. 7, the output signal 822 of latch 812 and the output signal 824 of latch 814 are used to generate U2 in the phase detector of FIG. 8. In addition, the output signal 824 of latch 814 and the output signal 826 of latch 816 are used to generate U3 in FIG. 8 in contrast with the circuit of FIG. 7. The modified triwave phase detector of FIG. 8 may be used to provide signals U1, U2, and U3 that have waveforms that are identical to the waveforms for the triwave phase detector of FIG. 7.

Figure 9:
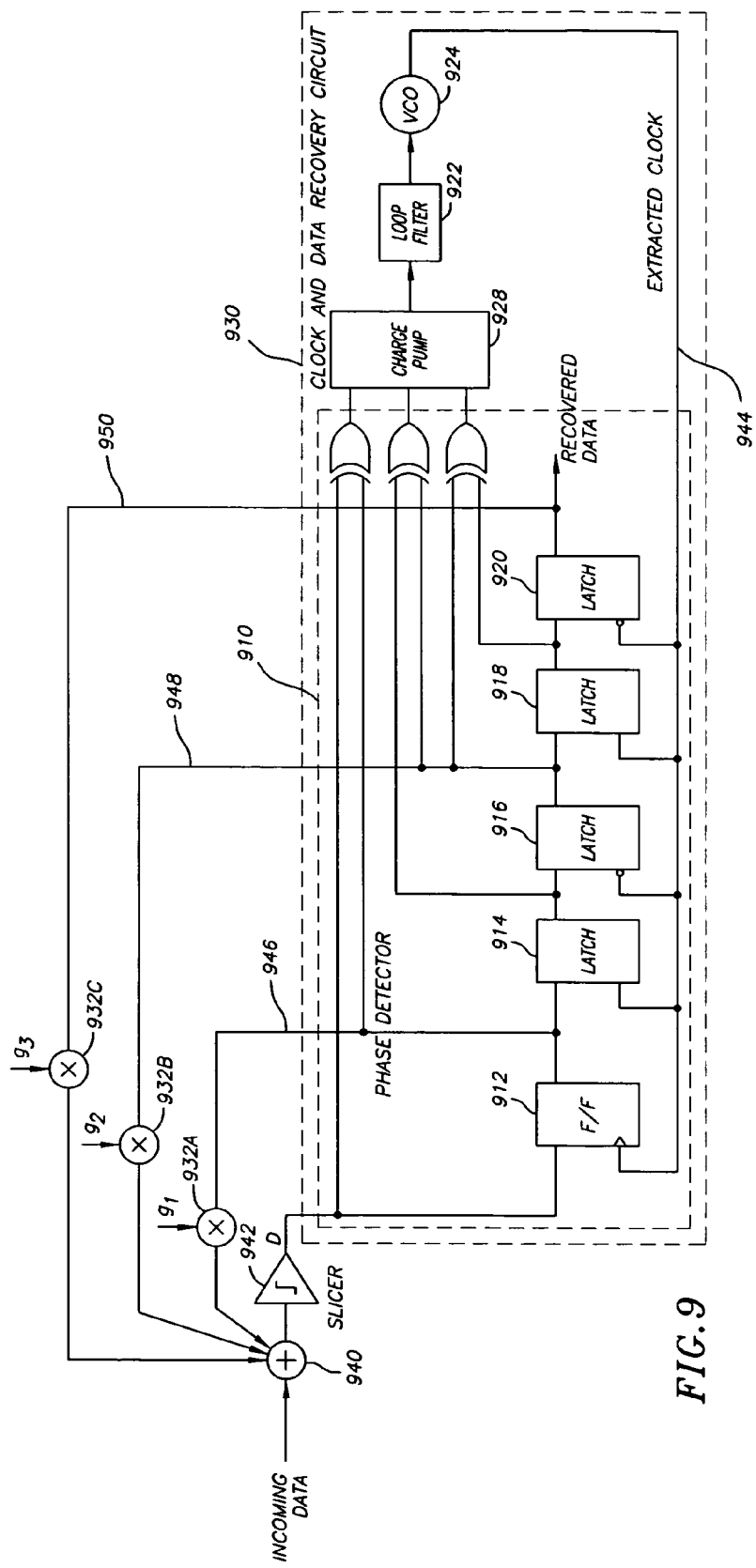
FIG. 9 is a simplified block diagram of one embodiment of an integrated decision feedback equalizer and clock and data recovery circuit incorporating a triwave phase detector constructed in accordance with the invention.

The flip-flops and latches in the modified triwave phase detector of FIG. 8 may be shared with a DFE. For example, FIG. 9 depicts one embodiment of a 3 tap DFE that shares 3 flip-flops (flip-flop 912, latch pair 914 and 916, and latch pair 918 and 920) of a phase detector 910. In this structure, a total of three high-speed flip-flops may be eliminated as compared to some conventional approaches.

The U1, U2 and U3 output signals of the phase detector 910 are provided to a charge pump 928 in the CDR 930. The charge pump 928 generates a current to drive loop filter 922 which in turn drives VCO 924. The VCO 924 generates an extracted clock signal 944 that clocks the flip-flops.

Multipliers 932A, 932B and 932C multiply the respective outputs of the three flip-flops by equalization coefficients g1, g2 and g3, respectively, to provide feedback signals to the summer 940. The resulting summed signal is processed by slicer 942 to generate the input data (D) for the CDR 930. In this embodiment, the output 950 of the third flip-flop (the output of latch 920) provides the recovered data.

Figure 10:
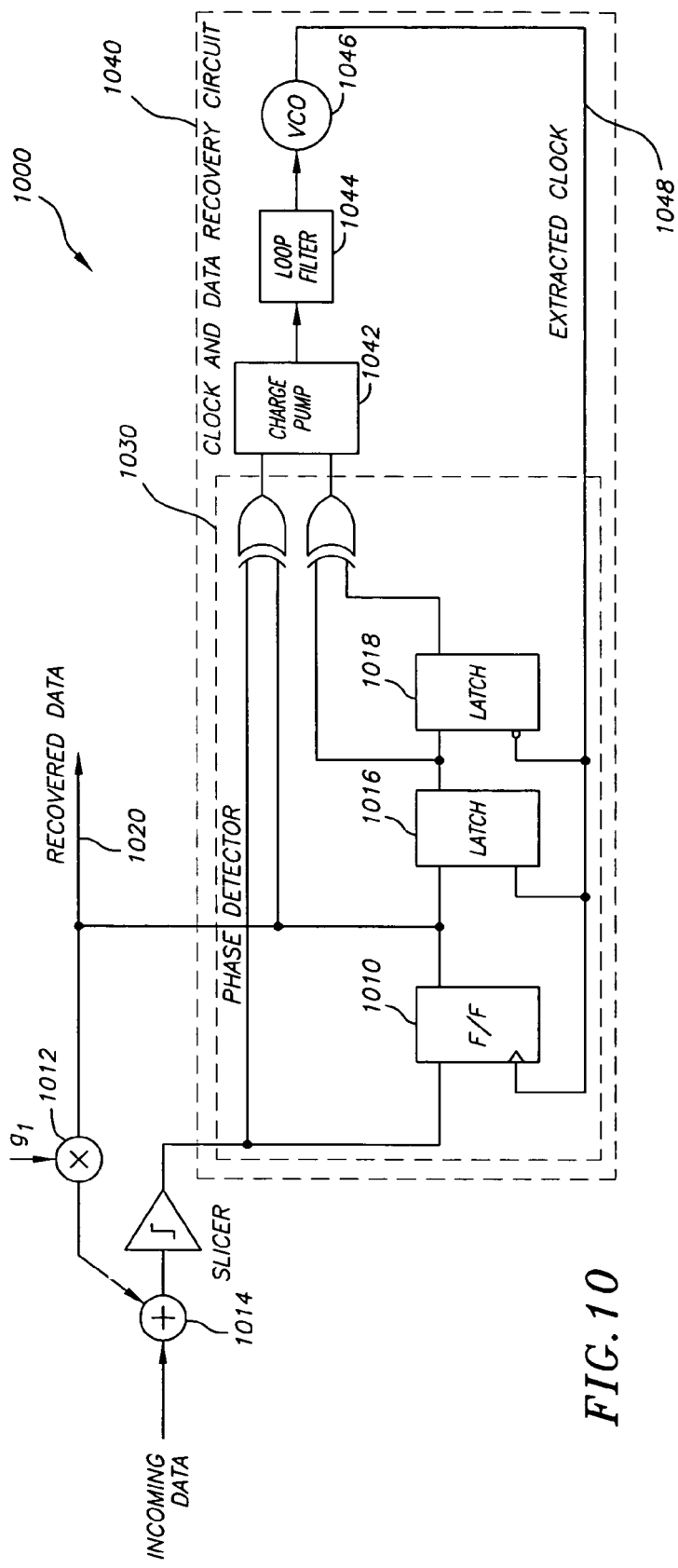
FIG. 10 is a simplified block diagram of one embodiment of an integrated one tap decision feedback equalizer and clock and data recovery circuit constructed in accordance with the invention.

The teachings discussed herein may be implemented in receivers that incorporate various architectures. For example, FIG. 10 illustrates one embodiment of an integrated one tap decision feedback equalizer and clock and data recovery circuit 1000. In the one tap DFE, the output of the first phase detector flip-flop 1010 is multiplied by g1 at multiplier 1012 and only this signal is fed back to the summer 1014. The output of the first flip-flop 1010 also provides the recovered data 1020.

The extracted clock signal 1048 that clocks the two flip-flops (flip-flop 1010 and latch pair 1016 and 1018) is generated by the phase detector 1030, charge pump 1042, loop filter 1044 and VCO 1046 in the CDR 1040 as described above.

In this embodiment, the integration of the DFE and the CDR provides an effective elimination of one flip-flop. This topology may be used with many different phase detectors because it only requires one flip-flop for the DFE. For example, the CDR may incorporate a Hogge phase detector or a binary phase detector.

Figure 11:
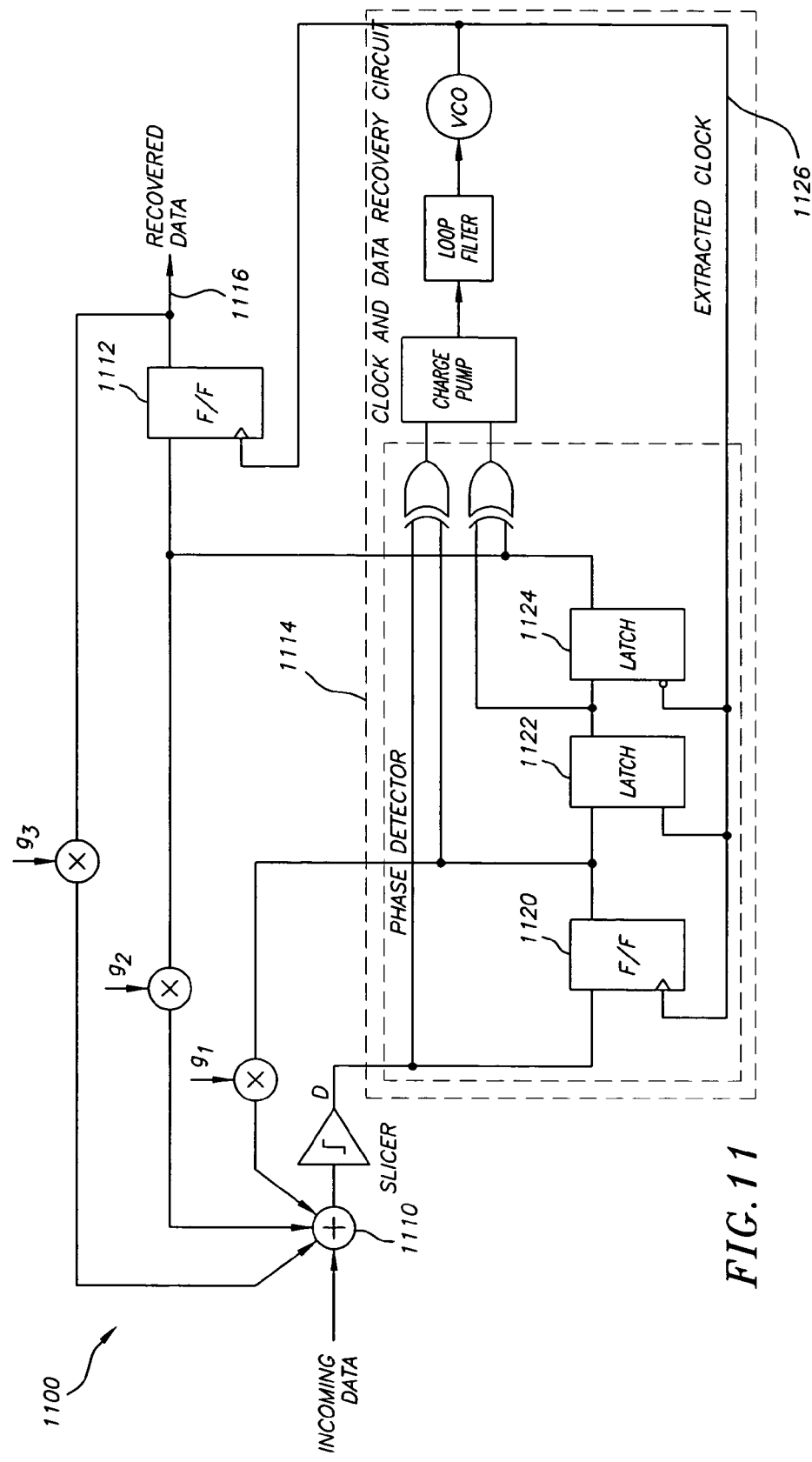
FIG. 11 is a simplified block diagram of one embodiment of an integrated three tap decision feedback equalizer and clock and data recovery circuit constructed in accordance with the invention.

If a higher order DFE is required, the phase detector of FIG. 10 may provide the first two taps. The remaining taps may be provided by flip-flops in the DFE. For example, FIG. 11 illustrates one embodiment of an integrated three tap decision feedback equalizer and clock and data recovery circuit 1100.

The CDR 1114 operates essentially as discussed above in conjunction with FIG. 10. With the addition of a DFE flip-flop 1112, however, the output of the second flip-flop (the output of latch 1124) provides the data input for the DFE flip-flop 1112 and the extracted clock signal 1126 also clocks the DFE flip-flop 1112. In addition, the output signals from the three flip-flops (flip-flop 1120, latch pair 1122 and 1124 and flip-flop 1112) are fed back to the summer 1110. The output of the DFE flip-flop 1112 provides the recovered data 1116.

Similarly, a receiver with a four tap DFE may incorporate two flip-flops in the phase detector and two additional flip-flops as part of the DFE. In this case, a total of 4 flip-flops would be necessary as opposed to six flip-flops, that may be required if this topology was not used. It should thus be understood that the teachings discussed herein may be incorporated into other multi-tap DFEs.

It should also be appreciated that using the techniques described herein, phase detector structures that do not readily lend themselves to flip-flop and/or latch sharing may, in many cases, be modified to enable such sharing. Moreover, this may be accomplished without compromising the performance of the phase detector. Such a modification is discussed above, for example, in conjunction with the embodiment of FIG. 9.

Figure 12:
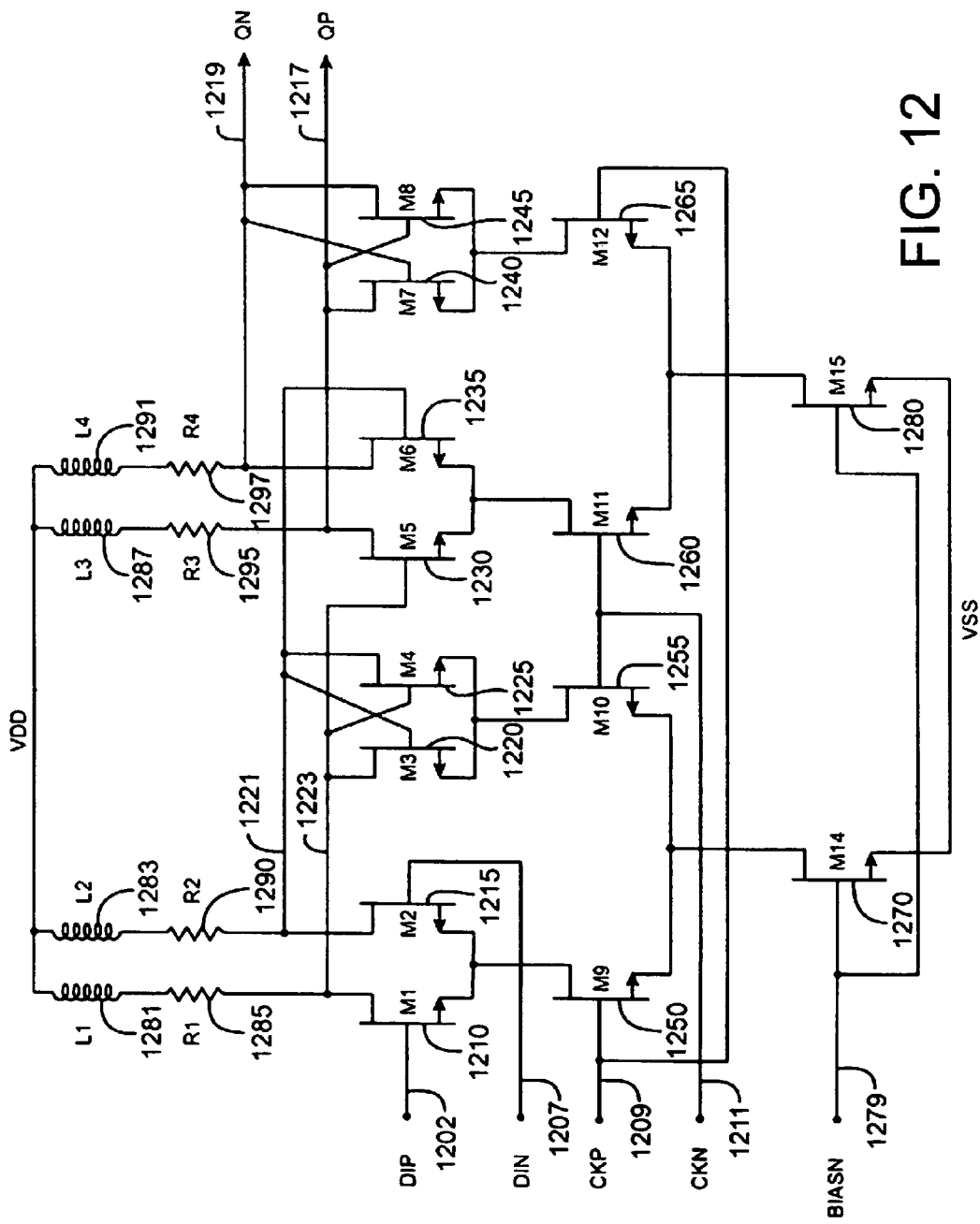
FIG. 12 is a simplified circuit diagram of one embodiment of a shunt peaking (inductive broadbanding) flip-flop.
Figure 13:
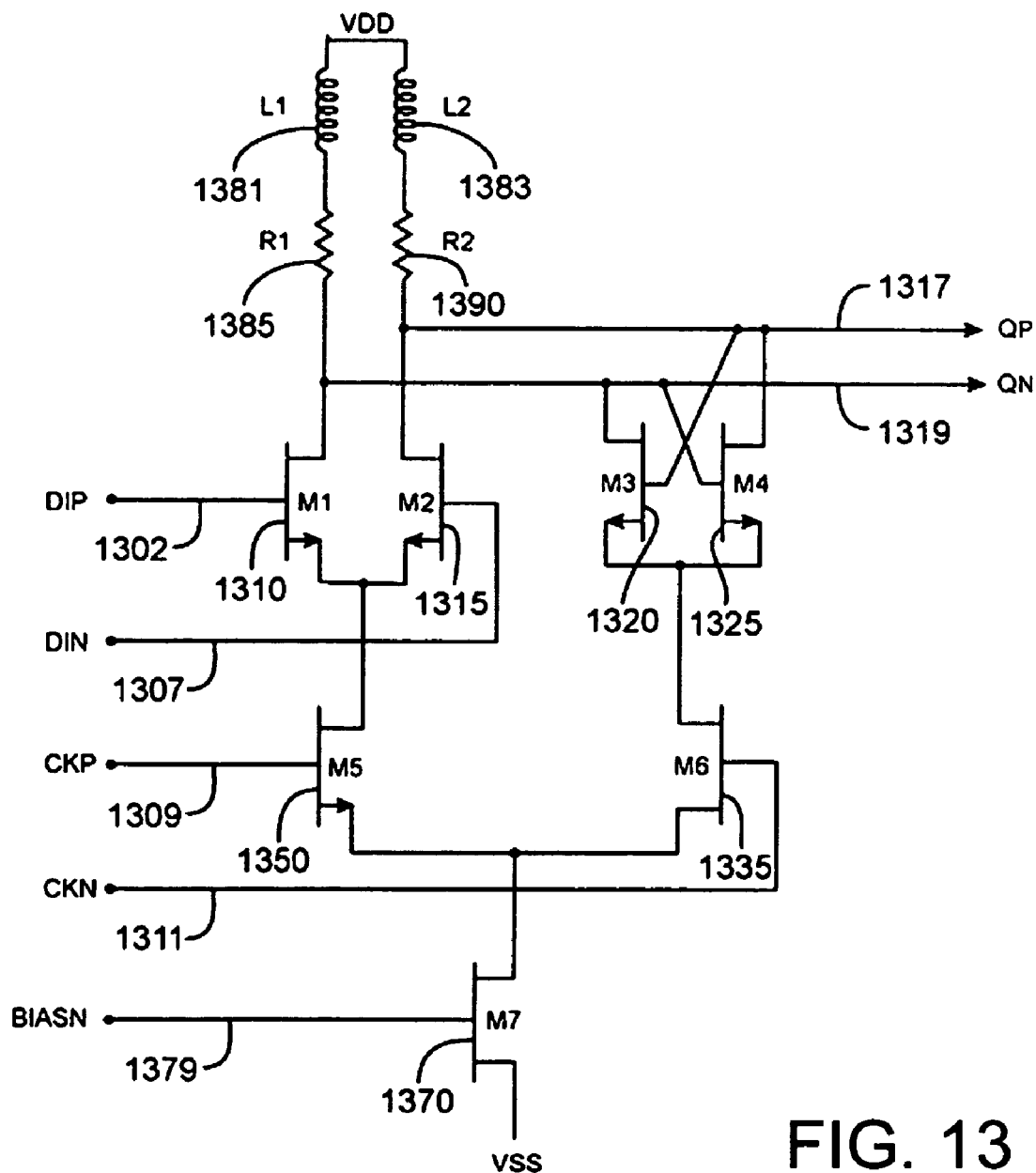
FIG. 13 is a simplified circuit diagram of one embodiment of a shunt peaking (inductive broadbanding) latch.

FIGS. 12 and 13 describe example embodiments of a shunt peaking flip-flop and a shunt peaking latch, respectively, that may be used in a high speed CMOS receiver constructed according to the teachings herein. In these embodiments the flip-flops and latches have differential clock and data inputs and differential data outputs. FIGS. 12 and 13 illustrate that the flip-flop may be constructed of two latches connected in series as discussed above.

FIG. 12 is a schematic of one embodiment of a negative-edge triggered flip-flop based on current controlled CMOS ($C^3$MOS) logic with shunt peaking (e.g., inductive broadbanding) aspects. Additional details of $C^3$MOS logic with inductive broadbanding is described in commonly owned U.S. patent application Ser. No. 09/610,905, filed Jul. 6, 2000, the disclosure of which is incorporated herein by reference.

The flip-flop of FIG. 12 comprises two latches, a master and a slave, in series. The master latch includes input differential pair M1 1210 and M2 1215, latching devices M3 1220 and M4 1225, clock pair M9 1250 and M10 1255, current source M14 1270, and series combination loads L1 1281 and R1 1285, and L2 1283 and R2 1290. The slave latch includes input differential pair M5 1230 and M6 1235, latching devices M7 1240 and M8 1245, clock pair M11 1260 and M12 1265, current source M15 1280, and series combination loads L3 1287 and R3 1295, and L4 1291 and R4 1297. Data input signals DIP and DIN are received on lines 1202 and 1207, clock input signals CKP and CKN are received on lines 1209 and 1211, a bias voltage signal BIASN is received on line 1279, and output signals QP (true) and QN (complementary) are provided on lines 1217 and 1219. The power supply signals as shown here as VDD and VSS. Additional details of the operation and construction of these components is provided in U.S. patent application Ser. No. 10/293,163, filed Nov. 12, 2002.

FIG. 13 is a schematic of one embodiment of a latch incorporating inductive broadbanding. The latch includes input differential pair M1 1310 and M2 1315, latching devices M3 1320 and M4 1325, clock pair M5 1350 and M6 1355, current source M7 1370, and series combination loads L1 1381 and R1 1385, and L2 1383 and R2 1390. Data input signals DIP and DIN are received on lines 1302 and 1307, clock input signals CKP and CKN are received on lines 1309 and 1311, a bias voltage signal BIASN is received on line 1379, and output signals QP (true) and QN (complementary) are provided on lines 1317 and 1319. The power supply signals as shown here as VDD and VSS.

It should be appreciated that other types of flip-flops and latches may be used including for example, bi-polar devices, devices made of GaAs on silicon, or other types of devices. Another embodiment of a flip-flop is described in commonly owned U.S. patent application Ser. No. 09/784,419, filed Feb. 15, 2002, the disclosure of which is incorporated herein by reference. Alternatively, as with the included schematics, current source loads, p-channel loads operating in their triode regions, or source follower outputs may be used. N-channel metal oxide semiconductor field effect transistors (MOSFET, or NMOS) are shown but, alternately, as with all the included schematics, p-channel (PMOS) devices may be used.

The integrated decision feedback equalizer and clock and data recovery circuits described herein may be integrated into any of a variety of applications. For example, referring to FIG. 14, the described exemplary integrated decision feedback equalizer and clock and data recovery circuit may be incorporated into the optical receiver assembly 1410 of an optical communication system 1400. The optical system 1400 includes an optical transmitter 1420 and an optical fiber network 1430 that carries the optical signal to the optical receiver assembly 1410. Those skilled in the art will appreciate that the teachings of the invention are not limited to a single optical transmitter and receiver or to optical receivers. For example, practical optical communications systems may have one or more optical transmitters as well as one or more optical receivers.

The illustrated receive path includes an optical detector 1435, sensing resistor 1440, one or more amplifier(s) 1450, and an integrated decision feedback equalizer and clock and data recovery circuit 1460. The optical detector 1435 may comprise a known prior art optical detector implementation. Such prior art detectors convert incoming optical signals into corresponding electrical output signals that may be electronically monitored.

A transmit path includes, by way of example, one or more gain stage(s) 1470 coupled to an optical transmitter 1475. The gain stage(s) 1470 may have multiple stages, and may receive one or more control signals for controlling various different parameters of the output of the optical transmitter. In one embodiment an analog data source provides an analog data signal that modulates the output of the optical transmitter. In other embodiments, baseband digital modulation or frequency modulation may be used.

In this embodiment, the gain stage(s) 1470 amplify the incoming data signal from the data source according to laser control signals. The amplified data signal, in turn, drives the optical transmitter 1475.

The optical transmitter may, for example, be a light emitting diode or a surface emitting laser or an edge emitting laser that operate at high speeds such as 10 Gigabits per second (Gbps) or higher. The optical transmitter 1475 thereby generates an optical data signal that provided to a fiber optic cable 1430.

The fiber optic cable 1430 carries the optical data signal to the optical detector 1435. In operation, when the transmit optical beam is incident on a light receiving surface area of the optical detector, electron-hole pairs are generated. A bias voltage applied across the optical detector 1435 generates a flow of electric current having an intensity proportional to the intensity of the incident light. In one embodiment, this current flows through sensing resistor 1440, and generates a voltage.

The sensed voltage is amplified by the one or more amplifier(s) 1450 and the output of amplifier(s) 1450 drives the integrated decision feedback equalizer and clock and data recovery circuit 1460. As illustrated in FIG. 6, the decision feedback equalizer may include, by way of example, a slicer that generates a binary signal (D) that drives a clock and data recovery circuit. The clock and data recovery circuit generates an extracted clock signal from the binary signal that is then used to retime the equalized data as discussed above.

A receiver constructed according to the invention may support various data protocols and date rates. For example, in one embodiment the receiver is a multi-rate SONET/SDH/10GE/FEC receiver that may operate at very high speeds including, for example, 9.953, 10.3125, 10.664 or 10.709 Gbps. This receiver includes, in a single chip solution, an optical equalizer and CDR as discussed above, a linear amplifier, deserializer and other components.

In one embodiment the receiver chip is implemented using CMOS technology. However, the teachings herein are applicable to other types of processes including for example, GaAs, Bi-MOS, Bipolar, etc.

Different embodiments of the invention may include a variety of hardware and software processing components. In some embodiments of the invention, hardware components such as controllers, state machines and/or logic are used in a system constructed in accordance with the invention. In some embodiment of the invention, code such as software or firmware executing on one or more processing devices may be used to implement one or more of the described operations.

Such components may be implemented on one or more integrated circuits. For example, in some embodiments several of these components may be combined within a single integrated circuit. In some embodiments some of the components may be implemented as a single integrated circuit. In some embodiments some components may be implemented as several integrated circuits. For example, in one embodiment the integrated DFE and CDR may be implemented on a single receiver chip.

The components and functions described herein may be connected/coupled in many different ways. The manner in which this is done may depend, in part, on whether the components are separated from the other components. In some embodiments some of the connections represented by the lead lines in the drawings may be in an integrated circuit, on a circuit board and/or over a backplane to other circuit boards. In some embodiments some of the connections represented by the lead lines in the drawings may comprise a data network, for example, a local network and/or a wide area network (e.g., the Internet).

The signals discussed herein may take several forms. For example, in some embodiments a signal may be an electrical signal transmitted over a wire while other signals may consist of light pulses transmitted over an optical fiber. A signal may comprise more than one signal. For example, a differential signal comprises two complementary signals or some other combination of signals.

Signals as discussed herein also may take the form of data. For example, in some embodiments an application program may send a signal to another application program. Such a signal may be stored in a data memory.

The components and functions described herein may be connected/coupled directly or indirectly. Thus, in some embodiments there may or may not be intervening devices (e.g., buffers) between connected/coupled components.

In summary, the invention described herein generally relates to an improved communications receiver. While certain exemplary embodiments have been described above in detail and shown in the accompanying drawings, it is to be understood that such embodiments are merely illustrative of and not restrictive of the broad invention. In particular, it should be recognized that the teachings of the invention apply to a wide variety of systems and processes. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims.

What is claimed is:

1. An integrated decision feedback equalizer and clock and data recovery circuit, comprising:
    a decision feedback equalizer including:
        a flip-flop that outputs a first feedback signal, and
        a sub-portion of a plurality of latches, wherein each latch of the sub-portion of the plurality of latches outputs a respective latch-generated feedback signal;
    a clock recovery circuit including:
        the flip-flop that outputs a first phase detector input signal, and
        the plurality of latches, wherein each latch in the plurality of latches outputs a respective latch-generated phase detector input signal,
        wherein the plurality of latches receives the output of the flip-flop as a first input to the plurality of latches, and
        wherein the plurality of latches includes both the sub-portion of a plurality of latches and latches which are not included by the sub-portion of a plurality of latches; and
    the flip-flop that is included by both the decision feedback equalizer and the clock recovery circuit.

2. The integrated decision feedback equalizer and clock and data recovery circuit of claim 1 wherein:
    the decision feedback equalizer generates a binary data signal;
    the clock recovery circuit generates an extracted clock signal;
    the flip-flop is coupled to receive the binary data signal and the extracted clock signal to generate the flip-flop output signal; and
    the flip-flop output signal is provided to the decision feedback equalizer to provide the first feedback signal and is provided to the clock recovery circuit to provide the first phase detector signal.

3. The integrated decision feedback equalizer and clock and data recovery circuit of claim 2 comprising a plurality of latches coupled to receive the flip-flop output signal to generate latch output signals,
    wherein the plurality of latches are cascaded in series, and
    wherein the latch output signals comprise at least one latch-generated feedback signal for the decision feedback equalizer and at least two latch-generated phase detector signals for the clock recovery circuit.

4. The integrated decision feedback equalizer and clock and data recovery circuit of claim 3 wherein the clock recovery circuit comprises an XOR circuit coupled to receive the binary data signal, the first phase detector signal and the latch-generated phase detector signals to generate at least one phase detector output signal.

5. The integrated decision feedback equalizer and clock and data recovery circuit of claim 4 wherein the clock recovery circuit comprises a charge pump coupled to receive the at least one phase detector output signal.

6. The integrated decision feedback equalizer and clock and data recovery circuit of claim 5 wherein the clock recovery circuit comprises:
    a loop filter coupled to receive an output signal from the charge pump; and
    a voltage controlled oscillator coupled to receive an output signal from the loop filter to generate the extracted clock signal.

7. The integrated decision feedback equalizer and clock and data recovery circuit of claim 2 wherein the decision feedback equalizer comprises:
    a multiplier coupled to receive the flip-flop output signal to generate a scaled feedback signal;
    a summer coupled to receive an input data signal and the scaled feedback signal to generate a soft decision data signal; and
    a slicer coupled to receive the soft decision data signal to generate the binary data signal.

8. The integrated decision feedback equalizer and clock and data recovery circuit of claim 3 wherein the decision feedback equalizer comprises:
    a plurality of multipliers coupled to receive the flip-flop output signal and at least a portion of the latch output signals to generate scaled feedback signals;
    a summer coupled to receive an input data signal and the scaled feedback signals to generate a soft decision data signal; and
    a slicer coupled to receive the soft decision data signal to generate the binary data signal.

9. The integrated decision feedback equalizer and clock and data recovery circuit of claim 2 wherein the flip-flop output signal comprises a recovered data signal.

10. The integrated decision feedback equalizer and clock and data recovery circuit of claim 3 wherein one of the latch output signals comprises a recovered data signal.

11. The integrated decision feedback equalizer and clock and data recovery circuit of claim 3 wherein:
    the extracted clock signal clocks the flip-flop and the latches; and
    at least two of the latches are clocked by different polarities of the extracted clock signal.

12. An integrated decision feedback equalizer and clock and data recovery circuit, comprising:
    a summer coupled to receive an input data signal and at least one scaled feedback signal to generate a soft decision data signal;
    a slicer coupled to receive the soft decision data signal to generate a binary data signal;

a flip-flop coupled to receive the binary data signal and an extracted clock signal to generate a first output signal;

a plurality of latches coupled to receive the first output signal to generate second output signals;

a charge pump coupled to receive at least one phase detector output signal associated with the first output signal and the second output signals;

a loop filter coupled to receive an output signal from the charge pump;

a voltage controlled oscillator coupled to receive an output signal from the loop filter to generate the extracted clock signal; and a multiplier coupled to receive the first output signal to generate the at least one scaled feedback signal.

13. The integrated decision feedback equalizer and clock and data recovery circuit of claim 12 comprising a plurality of XOR circuits coupled to receive the binary data signal, the first output signal and at least a portion of the second output signals to generate the at least one phase detector output signal.

14. The integrated decision feedback equalizer and clock and data recovery circuit of claim 12 comprising at least one multiplier coupled to receive at least a portion of the second output signals to generate the at least one scaled feedback signal.

15. The integrated decision feedback equalizer and clock and data recovery circuit of claim 12 wherein:
the extracted clock signal clocks the flip-flop and the latches; and
at least two of the latches are clocked by different polarities of the extracted clock signal.

16. An integrated decision feedback equalizer and clock and data recovery circuit, comprising:
a summer coupled to receive an input data signal and a plurality of scaled feedback signals to generate a soft decision data signal;
a slicer coupled to receive the soft decision data signal to generate a binary data signal;
a flip-flop coupled to receive the binary data signal and an extracted clock signal to generate a first output signal;
a first latch coupled to receive the first output signal to generate a second output signal;
a second latch coupled to receive the second output signal to generate a third output signal;
an XOR circuit coupled to receive the binary data signal, the first output signal, the second output signal and the third output signal to generate at least one phase detector output signal;
a charge pump coupled to receive the at least one phase detector output signal;
a loop filter coupled to receive an output signal from the charge pump;
a voltage controlled oscillator coupled to receive an output signal from the loop filter to generate the extracted clock signal; and
a plurality of multipliers coupled to receive the first output signal and the third output signal to generate the scaled feedback signals.

17. The integrated decision feedback equalizer and clock and data recovery circuit of claim 16 wherein the third output signal comprises a recovered data signal.

18. The integrated decision feedback equalizer and clock and data recovery circuit of claim 16 wherein:
the extracted clock signal clocks the flip-flop, the first latch and the second latch; and
the first latch and the second latch are clocked by different polarities of the extracted clock signal.

19. The integrated decision feedback equalizer and clock and data recovery circuit of claim 16 comprising:
a third latch coupled to receive the third output signal to generate a fourth output signal; and
a fourth latch coupled to receive the fourth output signal to generate a fifth output signal; wherein:
the multipliers are coupled to receive the fifth output signal to generate the scaled feedback signals; and
the XOR circuit is coupled to receive the fourth output signal to generate the at least one phase detector output signal.

20. The integrated decision feedback equalizer and clock and data recovery circuit of claim 19 wherein the fifth output signal comprises a recovered data signal.

21. The integrated decision feedback equalizer and clock and data recovery circuit of claim 19 wherein:
the extracted clock signal clocks the flip-flop, the first latch, the second latch, the third latch and the fourth latch; the first latch and the second latch are clocked by different polarities of the extracted clock signal; and
the third latch and the fourth latch are clocked by different polarities of the extracted clock signal.

22. A method of recovering data from a received data signal, comprising:
summing a received data signal and at least one scaled feedback signal to generate a soft decision data signal;
digitizing the soft decision data signal to generate a binary data signal;
generating a first output signal by clocking the binary data signal into a flip-flop using an extracted clock signal;
generating a second output signal by clocking the first output signal into a first latch using the extracted clock signal;
generating a third output signal by clocking the second output signal into a second latch using the extracted clock signal;
generating the at least one scaled feedback signal by multiplying the first output signal by a first equalization coefficient; and
generating the extracted clock signal according to the binary data signal, the first output signal, the second output signal and the third output signal.

23. The method of claim 22 wherein the first output signal comprises a recovered data signal.

24. The method of claim 22 comprising generating at least one input signal for a charge pump by XORing pairs of signals selected from the group consisting of the binary data signal, the first output signal, the second output signal and the third output signal.

25. The method of claim 22 wherein the first latch and the second latch are clocked by different polarities of the extracted clock signal.

26. The method of claim 22 comprising generating the at least one scaled feedback signal by multiplying the third output signal by a second equalization coefficient.

27. The method of claim 26 wherein the third output signal comprises a recovered data signal.

28. The method of claim 26 comprising:
generating a fourth output signal by clocking the third output signal into a third latch using the extracted clock signal;
generating a fifth output signal by clocking the fourth output signal into a fourth latch using the extracted clock signal;
generating the at least one scaled feedback signal by multiplying the fifth output signal by a third equalization coefficient; and generating the extracted clock signal according to the fourth output signal.

29. The method of claim 28 wherein the fifth output signal comprises a recovered data signal.

30. The method of claim 28 comprising generating at least one phase detector output signal by performing XOR operations on the binary data signal, the first output signal, the second output signal, the third output signal and the fourth output signal.

31. The method of claim 28 wherein the third latch and the fourth latch are clocked by different polarities of the extracted clock signal.

32. The method of claim 28 wherein: the flip-flop, the first latch and the third latch are clocked by the same polarity of the extracted clock signal, and the second latch and the fourth latch are clocked by the same polarity of the extracted clock signal;
where the flip-flop, the first latch and the third latch are clocked by different polarities of the extracted clock signal than the second latch and the fourth latch.

33. An integrated retimer and phase detector, comprising:
a flip-flop comprising:
at least one data input for receiving a binary data signal generated from a received signal;
at least one clock input for receiving an extracted clock signal; and
at least one output for outputting a first output signal, wherein the first output signal comprises a feedback signal for a decision feedback equalizer and a first phase detector signal for a clock recovery circuit;
a first latch comprising:
at least one data input for receiving the first output signal;
at least one clock input for receiving the extracted clock signal; and
at least one output for providing a second phase detector signal for the clock recovery circuit; and
a second latch comprising:
at least one data input for receiving the second phase detector signal;
at least one clock input for receiving the extracted clock signal; and
at least one output for providing a second output signal, wherein the second output signal comprises a third phase detector signal for the clock recovery circuit.

34. The integrated retimer and phase detector of claim 33 wherein the second output signal comprises a second feedback signal for the decision feedback equalizer.

35. The integrated retimer and phase detector of claim 33 wherein the first latch and the second latch are clocked by different polarities of the extracted clock signal.

36. The integrated retimer and phase detector of claim 33 comprising an XOR circuit coupled to receive the binary data signal, the first phase detector signal, the second phase detector signal and the third phase detector signal to generate at least one phase detector output signal.

37. The integrated retimer and phase detector of claim 34 comprising:
a third latch comprising:
at least one data input for receiving the second output signal;
at least one clock input for receiving the extracted clock signal; and at least one output for providing a fourth phase detector signal for the clock recovery circuit; and
a fourth latch comprising: at least one data input for receiving the fourth phase detector signal;
at least one clock input for receiving the extracted clock signal; and
at least one output for providing a third feedback signal for the decision feedback equalizer.

38. The integrated retimer and phase detector of claim 37 wherein the third latch and the fourth latch are clocked by different polarities of the extracted clock signal.

39. The integrated retimer and phase detector of claim 37 comprising an XOR circuit coupled to receive the binary data signal, the first phase detector signal, the second phase detector signal, the third phase detector signal and the fourth phase detector signal to generate at least one phase detector output signal.

40. A method of retiming data and generating phase detector signals, comprising:
generating a first output signal by clocking a binary data signal into a flip-flop;
providing the first output signal to a feedback loop of a decision feedback equalizer;
generating at least one phase detector output signal using the first output signal; and
generating a second output signal by clocking the first output signal into a first latch;
generating the at least one phase detector output signal using the second output signal;
generating a third output signal by clocking the second output signal into a second latch;
providing the third output signal to the feedback loop of the decision feedback equalizer; and
generating the at least one phase detector signal using the third output signal.

41. The method of claim 40, wherein generating a first output signal by clocking a binary data signal into a flip-flop comprises using an extracted clock signal;
wherein generating a second output signal by clocking the first output signal into a first latch comprises using the extracted clock signal; and
wherein generating a third output signal by clocking the second output signal into a second latch comprises using the extracted clock signal.

42. The method of claim 41 wherein the first latch and the second latch are clocked by different polarities of the extracted clock signal.

43. The method of claim 41 wherein an XOR circuit is coupled to receive the binary data signal, the first output signal, the second output signal and the third output signal to generate the at least one phase detector output signal.

44. The method of claim 41 comprising:
generating a fourth output signal by clocking the third output signal into a third latch using the extracted clock signal;
generating the at least one phase detector output signal using the fourth output signal;
generating a fifth output signal by clocking the fourth output signal into a fourth latch using the extracted clock signal; and
providing the fifth output signal to the feedback loop of the decision feedback equalizer.

45. The method of claim 44 wherein the third latch and the fourth latch are clocked by different polarities of the extracted clock signal.

46. The method of claim 44 wherein:
the flip-flop, the first latch and the third latch are clocked by the same polarity of the extracted clock signal, and the second latch and the fourth latch are clocked by the same polarity of the extracted clock signal;

where the flip-flop, the first latch and the third latch are clocked by different polarities of the extracted clock signal than the second latch and the fourth latch.

47. The method of claim 44 wherein an XOR circuit is coupled to receive the binary data signal, the first output signal, the second output signal, the third output signal and the fourth output signal to generate the at least one phase detector output signal.

* * * * *